United States Patent [19]
Murphy et al.

[11] Patent Number: 5,742,481
[45] Date of Patent: Apr. 21, 1998

[54] REMOVABLE TERMINAL SUPPORT MEMBER FOR INTEGRATED CIRCUIT SOCKET/ADAPTER ASSEMBLIES

[75] Inventors: James V. Murphy, Warwick; Robert N. Taylor, Coventry, both of R.I.

[73] Assignee: Advanced Interconnections Corporation, West Warwick, R.I.

[21] Appl. No.: 539,052

[22] Filed: Oct. 4, 1995

[51] Int. Cl.$^6$ ................... H05K 7/10; H01R 9/09
[52] U.S. Cl. ............ 361/767; 361/768; 361/783; 439/69
[58] Field of Search ................. 361/767, 768, 361/769, 771, 783, 785, 790, 791, 803, 804, 820; 439/70, 71, 83, 68, 69; 29/832, 840, 845; 228/179.1, 180.21, 180.22

[56] References Cited

U.S. PATENT DOCUMENTS

| | | | |
|---|---|---|---|
| 3,097,360 | 7/1963 | Carlson, Jr. et al. | 1/56 |
| 3,545,606 | 12/1970 | Bennett et al. | 206/56 |
| 3,892,313 | 7/1975 | Lange | 206/346 |
| 4,074,342 | 2/1978 | Honn et al. | 361/783 |
| 4,099,615 | 7/1978 | Lemke et al. | 206/329 |
| 4,373,778 | 2/1983 | Adham | 350/96.2 |
| 4,442,938 | 4/1984 | Murphy | 206/329 |
| 4,514,784 | 4/1985 | Williams et al. | 361/791 |
| 4,595,794 | 6/1986 | Wasserman | 361/769 |
| 4,620,757 | 11/1986 | Thevenaz | 339/17 C |
| 4,645,278 | 2/1987 | Yevak, Jr. et al. | 339/17 T |
| 4,645,287 | 2/1987 | Olsson | 339/125 R |
| 4,678,250 | 7/1987 | Romine et al. | 439/83 |
| 4,693,528 | 9/1987 | Asick et al. | 439/83 |
| 4,750,092 | 6/1988 | Werther | 361/783 |
| 4,838,801 | 6/1989 | Bertoglio et al. | 439/83 |
| 4,939,624 | 7/1990 | August et al. | 361/803 |
| 5,034,855 | 7/1991 | Komiyama | 361/416 |
| 5,135,890 | 8/1992 | Temple et al. | 228/180.22 |
| 5,144,412 | 9/1992 | Chang et al. | 361/783 |
| 5,145,386 | 9/1992 | Berg et al. | 439/83 |
| 5,168,432 | 12/1992 | Murphy et al. | 361/813 |
| 5,174,764 | 12/1992 | Kandybowski et al. | 439/83 |
| 5,184,285 | 2/1993 | Murphy et al. | 361/813 |
| 5,188,536 | 2/1993 | Ganthier et al. | 439/83 |
| 5,199,884 | 4/1993 | Kaufman et al. | 439/74 |
| 5,215,472 | 6/1993 | DelPrete et al. | 439/71 |
| 5,242,311 | 9/1993 | Seong | 439/135 |
| 5,277,597 | 1/1994 | Masami et al. | 439/83 |
| 5,336,118 | 8/1994 | McKee et al. | 439/83 |
| 5,373,984 | 12/1994 | Wentworth | 228/180.21 |
| 5,400,220 | 3/1995 | Swamy | 361/760 |
| 5,452,183 | 9/1995 | Renn et al. | 361/785 |
| 5,515,241 | 5/1996 | Werther | 361/767 |
| 5,537,295 | 7/1996 | Van Den Bout et al. | 361/767 |
| 5,538,433 | 7/1996 | Arisaka | 439/70 |

*Primary Examiner*—Michael W. Phillips
*Assistant Examiner*—John B. Vigushin
*Attorney, Agent, or Firm*—Fish & Richardson P.C.

[57] ABSTRACT

A socket/adapter assembly includes a insulative support member for supporting terminals soldered to connection regions of a leadless integrated circuit (IC) package, a printed circuit board, or another intercoupling component. The insulative support member is removable/replaceable from the terminals to allow visual inspection of the solder connections between the terminals and connection regions. The terminals of the socket/adapter assembly are retained by the insulative support member before the connections soldered. The insulative support member is then removed so that the individual solder connections can be examined for defective solder joints and repaired, if necessary.

17 Claims, 6 Drawing Sheets

REMOVABLE TERMINAL SUPPORT MEMBER FOR INTEGRATED CIRCUIT SOCKET/ADAPTER ASSEMBLIES

BACKGROUND OF THE INVENTION

This invention relates to making connections between integrated circuit packages (IC) and circuit boards.

Leadless integrated circuit (IC) packages (e.g., ball grid array (BGA) packages) are becoming increasingly popular because of their low profiles and high densities. The rounded solder ball contacts of a BGA are generally soldered directly to corresponding surface mount pads of a printed circuit board rather than to plated thru-holes which receive pins from, for example, a pin grid array IC package.

Traditionally, sockets and adapters are used with IC packages to allow the IC packages to be interchanged without permanent connection to the circuit board. However, problems exist in attaching a BGA package to conventional sockets and adapters. This is because the BGA package presents a non-traditional mating condition. The rounded solder balls of the BGA are themselves relatively poor points of contact for socketing, suited only for their intended purpose of being reflowed. The solder balls are generally inconsistent in shape, location and hardness. Moreover, the solder balls tend to cold flow over time against even the lowest of normal forces, and will fracture at their interfaces with the device if overly constrained or loaded. Thus, BGA packages soldered to conventional sockets and adapters circuit boards are difficult to reflow, expensive to inspect, and extremely difficult to rework.

SUMMARY OF THE INVENTION

This invention provides a reliable approach for visually inspecting solder connections between individual terminals of an adapter/socket assembly and the contacts of an integrated circuit package or circuit board. The terminals of the socket/adapter are retained within an insulative support member and the connections soldered. The insulative support member is then removed so that the individual solder connections can be examined for defective solder joints and repaired, if necessary.

In general, the invention features, an intercoupling component with an insulative support member having an array of holes located in a pattern corresponding to an array of connection regions of a substrate (e.g., a printed circuit board or leadless IC package). Terminal elements (e.g., pin or socket terminals), positioned within the holes are electrically connected (e.g., soldered) to corresponding ones of the array of connection regions. The holes are sized to allow the insulative support member to be slidably removed from and replaced on the terminal elements after the terminals are connected to the connection regions. Removing the support member allows the connections between the terminal elements and connection regions to be visually inspected and, if necessary, repaired.

The insulative support member generally has a thickness greater than 25% of a largest diameter (typically the head portion of the terminal) of the terminal elements. The thickness is sufficient for maintaining alignment of the terminal elements with respect to the connection regions. The difference between outer diameters of the terminal elements and inner diameters of corresponding first holes is generally between 1 and 5 mils so as to allow the support member to be easily removed from the terminal elements while providing adequate support to the terminal elements when the support member is returned to the elements.

The terminal elements may be further supported within the holes of the insulative support member by a thin insulative retaining sheet (e.g., a polyimide film) disposed over the holes. The terminal elements may include structure, such as a groove or rib, for supporting the sheet on the terminal element. Moreover, solder preforms may be positioned on the terminal to facilitate the soldering operation.

The insulative support member may include "via" holes extending through the member and positioned interstitially between the holes supporting the terminals to improve the flow of convection currents at the solder connection regions of the support member. The insulative support member may include alignment members positioned to align the terminal elements with corresponding connection regions.

In an adapter embodiment of the invention, the terminal elements are pin terminals for converting a leadless IC package (e.g., BGA) into a pin grid array package. The pin terminals are soldered to solder contacts of a leadless IC package. The insulative support member is removable to allow examination of the solder connections between the pin terminals and connection contacts of the leadless IC package. The holes for the pin terminals may include a counterbore so that after the terminal connections are soldered, the insulative support member can be removed, inverted, and reattached to the pin terminals so that the terminal connections at the head portions of the pin terminals are enclosed and protected within the counterbore.

In a socket embodiment, the solder connections between socket terminals and surface mounted pads of a printed circuit board (or another intercoupling component) may be examined by removing the insulative support member. The socket terminals generally include terminations, which contact the surface mounted pads, formed of a rigid material (e.g., Sn/Pb alloy).

The adapter and socket can be used together with the pin terminals received by socket terminals soldered to the printed circuit board to provide a non-permanent connection between the adapter and the socket. The socket member may include the same counterbore structure, thermal via holes, and retaining sheet discussed above in conjunction with the adapter.

In another embodiment, the insulative support member supports socket terminals electrically connected to connection regions of a leadless integrated circuit package. The sockets receive pin terminals which are electrically connected to surface mounted pads on a printed circuit board. With this arrangement, the leadless IC package is converted to a socket grid array.

Other features and advantages of the invention will be apparent from the following description of the preferred embodiments and from the claims.

DESCRIPTION OF THE PREFERRED EMBODIMENTS

Figure 1:
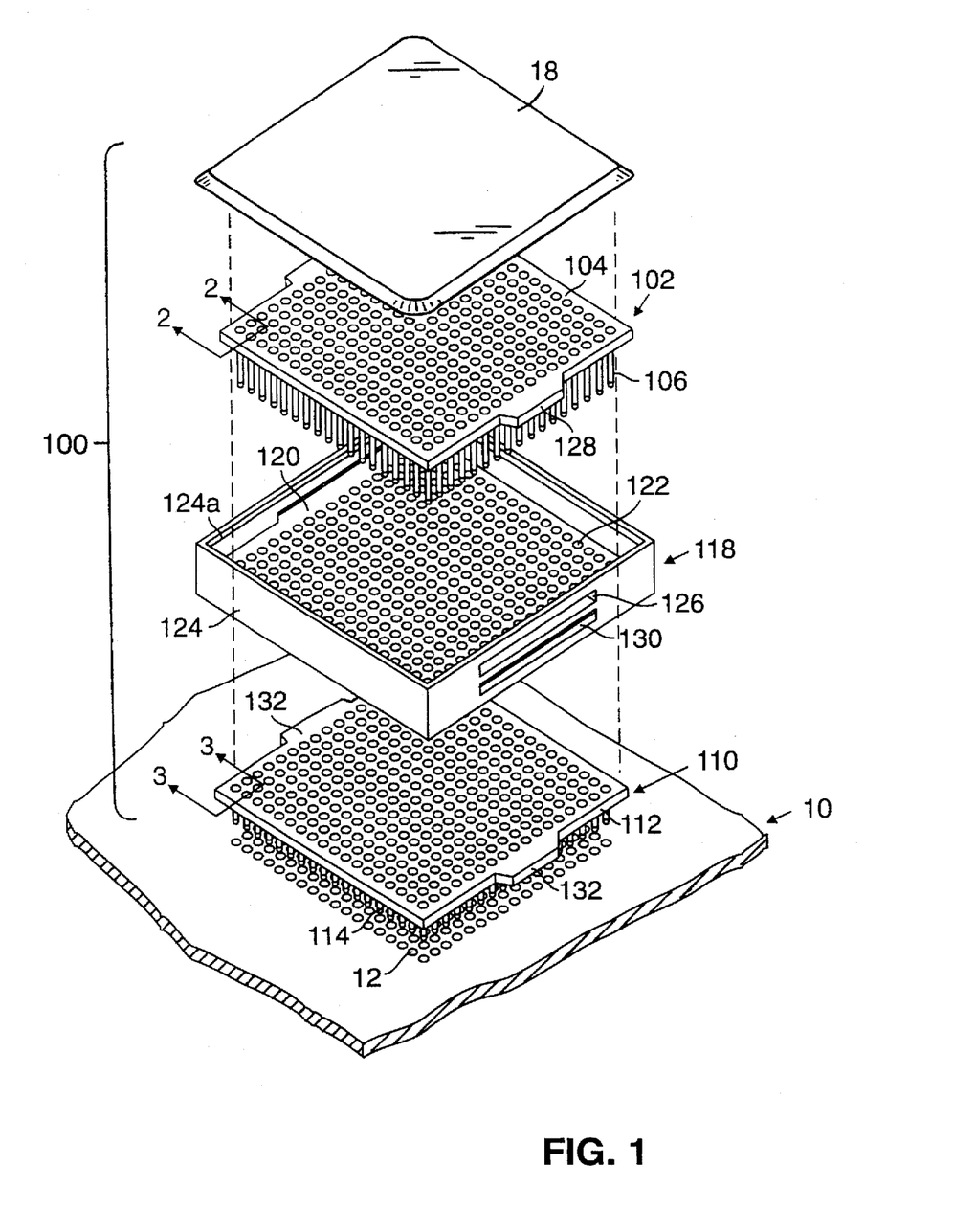
FIG. 1 is an exploded, somewhat diagrammatic, isometric view of a socket/adapter assembly for a ball grid array package.
Figure 4A:
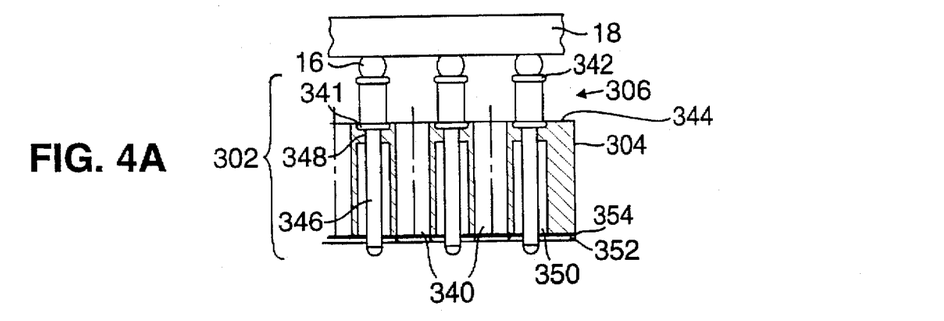
FIGS. 4A–4D are cross-sectional side views of a portion of an embodiment of an adapter and ball grid array package illustrating the removal and reattachment of the insulative support member to the terminals.
Figure 5:
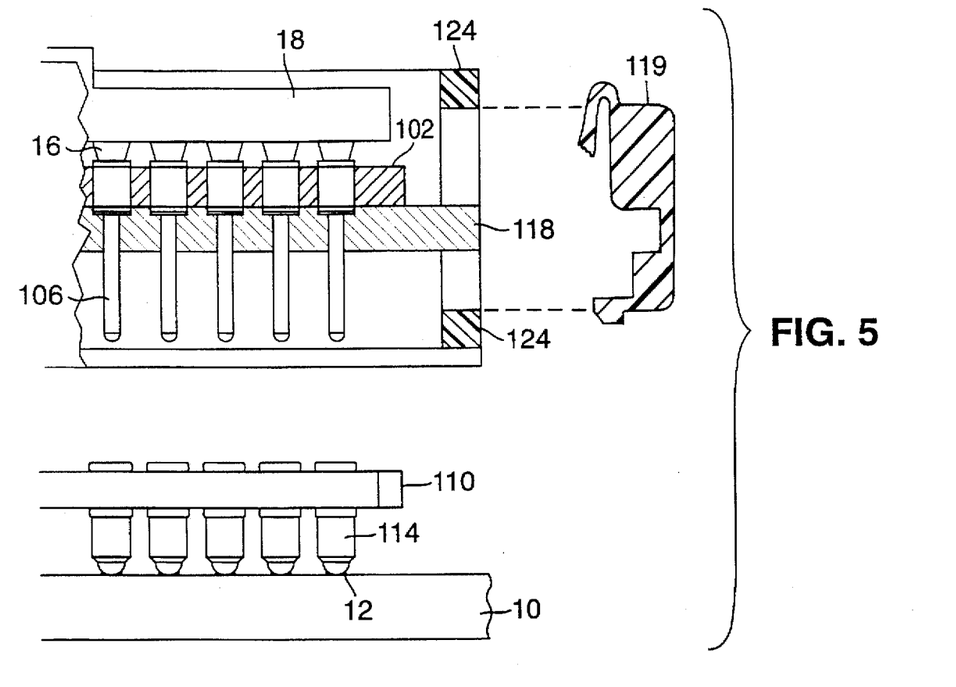
FIG. 5 is a partially exploded cross-sectional side view of an alternate embodiment of a socket/adapter assembly.
Figure 6:
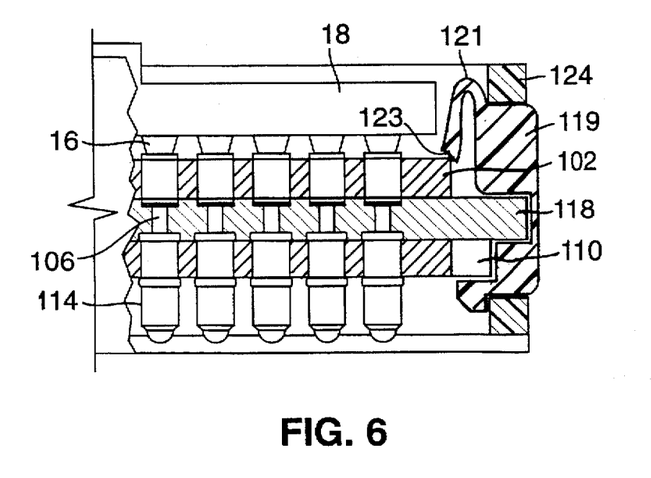
FIG. 6 is a cross-sectional side view of the assembled socket/adapter assembly of FIG. 5.

Referring to FIG. 1, an adapter/socket assembly 100, is shown positioned to be connected to surface mount pads 12 of a printed circuit board 10. Adapter/socket assembly 100 includes a pin adapter 102 having an electrically insulative member 104 supporting pin terminals 106 positioned within an array of holes 109 (FIG. 2) in a pattern corresponding to a footprint of rounded solder balls 16 (FIG. 4A) of a BGA package 18. When solder balls 16 of BGA package 18 are soldered to pin terminals 106 of pin adapter 102, the BGA package is converted to a high density pin grid array (PGA). Pin terminals 106 are received within socket terminals 114 of a socket 110. Socket 110 includes an insulative support member 112 for supporting the socket terminals 114 positioned within an array of holes in a pattern corresponding to the footprint of the surface mount pads 12. An alignment member 118 includes an insulative layer 120 having holes 122 for receiving pin terminals 106 of pin adapter 102. Alignment member 118 also includes walls 124 which form a guide box for contacting and aligning the outer peripheries of pin adapter 102 and socket 110. Upper slots 126 are formed in opposing walls 124 of the alignment member and engage tabs 128 formed along opposite sides of the outer edge of the insulative member of pin adapter 102. Similarly, lower slots 130 engage tabs 132 formed on the sides of the outer edge of support member 112 of socket 110. To facilitate inserting tab 128 into slot 126, the tab is chamfered along its lower edge with the upper edges of the pair of walls with slots 126 having a chamfer 124a. Similarly, tab 132 may be chamfered along its upper edge with the lower edges of the pair of walls with slots 130 also having a chamfer. Other latching mechanisms may also be used to secure pin adapter 102 within alignment member 118. For example, a slide clip 119 (as shown in FIGS. 5 and 6) may be snapped within slots 126, 130 to retain pin adapter 102 and socket 110 within alignment member 118. Slide clip 119 includes a resilient upper member 121 having sharp pointed appendages 123 for gripping an outer edge portion of pin adapter 102.

Figure 2:
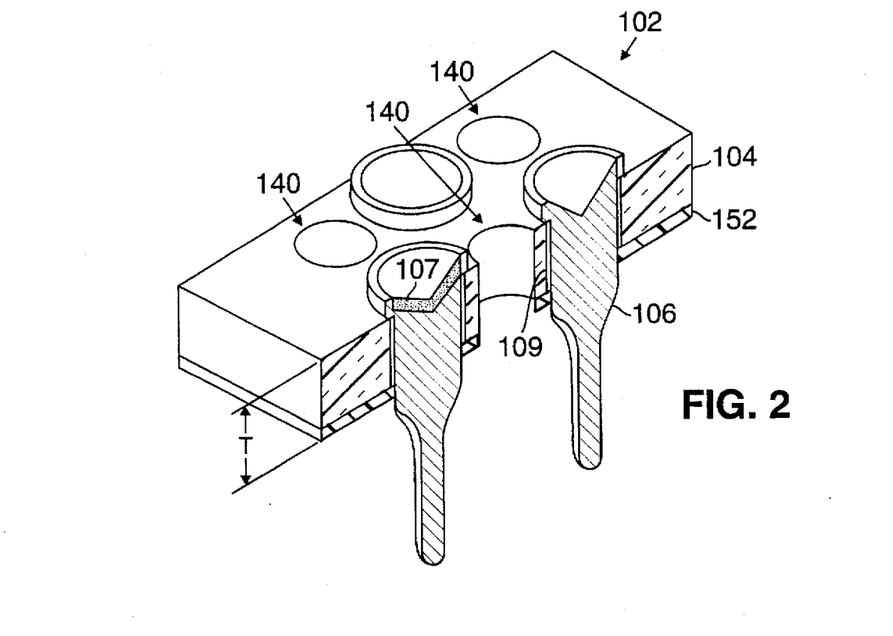
FIG. 2 is a cross-sectional, isometric view of a portion of a pin adapter assembly of the socket/adapter assembly taken along lines 2—2 of FIG. 1.

Referring to FIG. 2, insulative member 104 has a sufficient thickness (T) for lending support to the pin terminals 106 when they are soldered to ball contacts 16 (FIG. 4A) and, in particular, for supporting and maintaining alignment of the pin terminals after soldering. After the soldering operation, insulative member 104 can be removed from the terminals to allow the soldering connections to be examined and repaired where necessary and then returned to the terminals. Without the insulative member in place the terminals may be bent or broken from their solder connections. Generally, the thickness of insulative member 104 is at least 25% of the diameter of the portion of the terminal member surrounded by the insulative member. In one embodiment, 32 mil thick insulative member supports the cupped head portion (42 mil diameter) of the terminal pins.

The clearance between the outer diameter of pin terminals 106 and the insulative member 104 is generally between 1 and 5 mils so that the insulative member is easily slid off of the pin terminals while adequately supporting and protecting the terminals when the insulative member is replaced over the terminals.

Improved soldering conditions are provided in part by thermal via holes 140 provided between pin terminals 106. These holes, which represent about 18% of the surface area of the adapter, allow convection currents greater access to the solder balls, particularly those positioned at the innermost regions of BGA package 18. Thus, reflow occurs at lower temperatures and generally within shorter cycles. In addition, the pin terminals 106 operate as a thermal conduit for drawing heat to the reflow site, thereby improving the reflow characteristics of the solder connection. In some applications, solder preforms 107 may be positioned at the connection points between terminal pins 106 and solder balls 16 (FIG. 4A). The use of solder preforms or donuts may also be used as described in U.S. Pat. No. 5,168,432, assigned to the assignee of this invention and incorporated herein by references. A thin sheet of polyimide film 152, such as Kapton® (a registered trademark of E.I. DuPont de Nemours & Co., Wilmington, Del.), is positioned over a lower surface of the insulative member to support pin terminals within holes 109. As described below, film 152 is peeled from pin terminals 106 supported by insulative member 104, after soldering pin terminals 106 to solder balls 16, allowing the insulative member to be removed from the pin terminals.

In addition to providing a means for socketing a BGA IC package, pin adapter 102 allows the BGA package to be soldered under conditions that provide reliable solder connections. In contrast to soldering the BGA package to a PC board having many other components, pin adapter 102 is not populated by anything other than the BGA package. Thus, the reflow profile can be configured explicitly for a one BGA, one adapter scenario. Moreover, the insulative member 104 is relatively thin, but has sufficient rigidity to support pin terminals 106 without significantly increasing the profile of the adapter.

Figure 3:
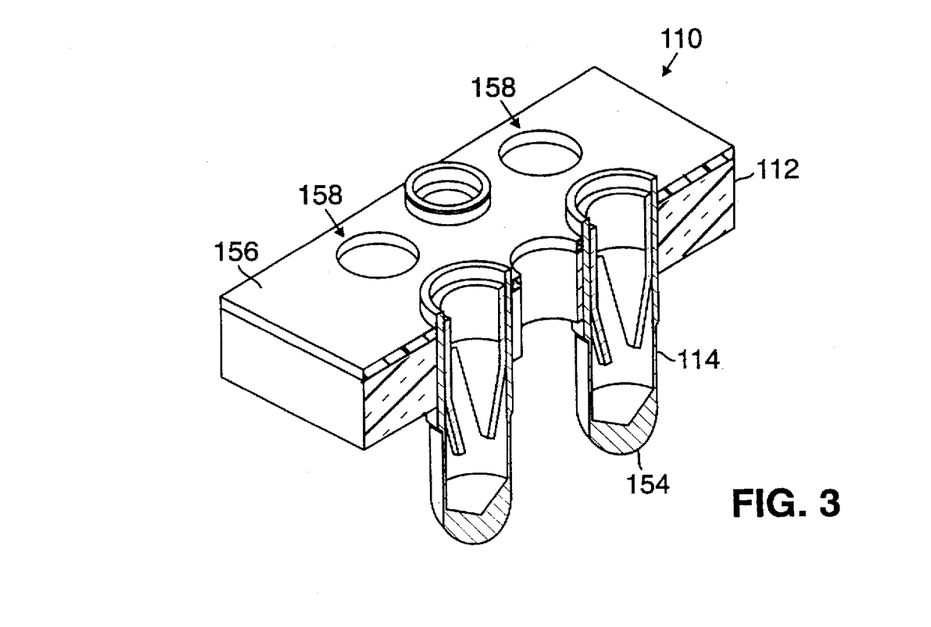
FIG. 3 is a cross-sectional side view of a portion of the socket assembly taken along lines 3—3 of FIG. 1.

Referring to FIG. 3, socket 110 of adapter/socket assembly 100 takes the position of the BGA package 18 on the PC board 10. Each socket terminal 114 may include a spheroid termination 154 at its distal end for soldering to the surface contacts of the PC board. The terminations are formed to have substantially the same shape as the rounded solder balls of the BGA package. The solder interface, therefore, has the same footprint and physical geometry as the BGA package. However, unlike, the rounded solder balls of the BGA package, which are formed entirely of solder, the terminations are fabricated from a brass alloy with Sn/Pb over Ni plating. Thus, the solder terminations maintain their physical geometry during soldering of socket terminals 114 and PC board 10. The socket 110 is, therefore, better suited than the BGA package for soldering to a PC board.

Socket 110 also includes a polyimide film 156 which is peeled-away after the soldering operation so that member 112 can be removed to allow visual inspection of the solder connections. Sockets 114 are generally low insertion force (LIF) type sockets, known as POP-TOP® sockets, described in U.S. Pat. No. 5,038,467, assigned to the assignee of this invention, and incorporated herein by reference. The relationship of the thickness of socket 110 to the diameter of socket terminals and the clearance therebetween is commensurate to that described above in conjunction with the pin adapter 102 of FIG. 2. Thermal via holes 158 are also provided to improve the reflow characteristics of the solder connections, as described above in conjunction with via holes 140 of adapter 102.

Referring to FIGS. 4A–4D, another construction of a pin adapter 302 allows the user to reliably solder BGA package 18 to pin adapter 302, inspect those solder connections for any defects, repair them if necessary and then protect the pin terminals from damage. As shown in FIG. 4A, before soldering, pin terminals 306 are supported within insulative member 304 with a lower ring 341 of the pin resting on the upper surface 344 of the insulative member. Cupped head 342 receives the rounded solder balls 16 of BGA package 18. The mating portion 346 of the pin terminals are disposed through holes 348 having a first diameter, approximately that of the slender mating portion of the pin terminals, and a larger counterbore 350. A thin sheet of polyimide film 352 is positioned over a lower surface 354 of the insulative member to support the pins within holes 348 and counterbore 350.

Figure 4B:
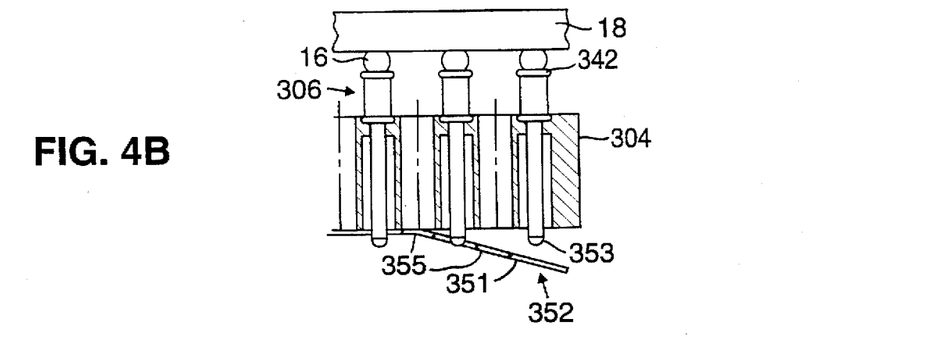

Referring to FIG. 4B, film 352 includes holes 351 for receiving the ends of pins 306. A groove 353 may be provided at the distal end of the slender portion of the pin to support the film. Use of such films for supporting terminals is described in U.S. No. RE32,540, assigned to the assignee of this invention, and incorporated herein by reference. Film 352 also includes holes 355 aligned with thermal via holes 340 to allow free flow of convection currents. After solder balls 16 are soldered to cupped heads 342 of pins 306, film 352 is peeled away from pin adapter 302 leaving behind insulative member 304 and pins 306 fixtured in place.

Figure 4C:
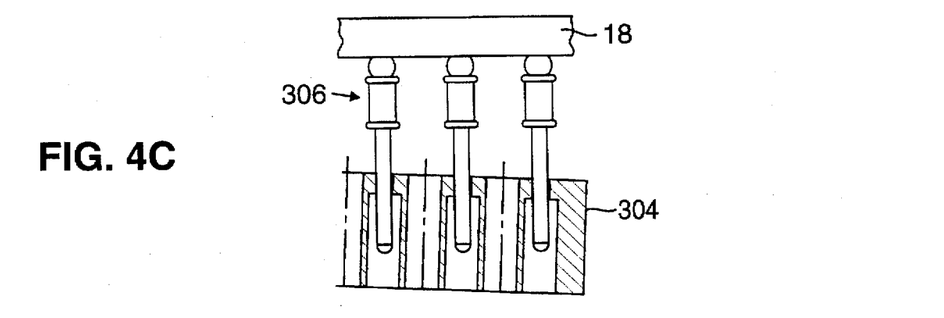
Figure 4D:
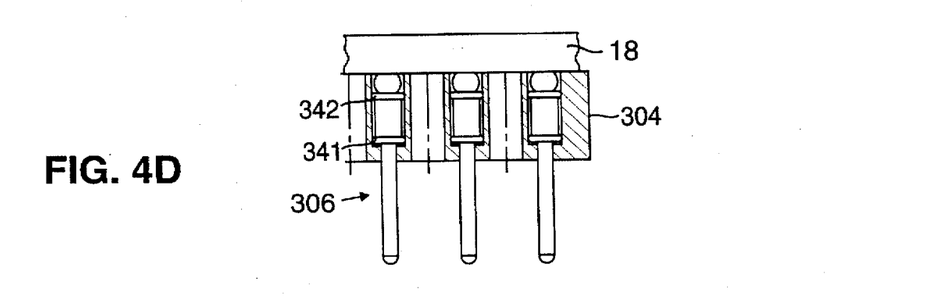

Referring to FIG. 4C, insulative member 304 can then be removed from pin terminals 306 to allow the solder connections to be inspected, cleaned and repaired if necessary. As shown in FIG. 4D, the insulative member advantageously allows the soldered connections between rounded solder balls 16 and pins 306 to be protected by inverting insulative member 304 and then sliding the insulative member back over the pins so that counterbore 350 fits over the larger diameter portion of pin terminal 306 including lower ring 341, cupped head 342 and the solder ball contacts.

Referring to FIGS. 5 and 6, alignment member 118 is shown serving as an attachable shroud designed to fit over pin adapter 102 after soldering of the adapter to BGA package 18. Alignment member 118 protects pin terminals 106 of the adapter during handling and provides alignment of the pins to socket terminals 114 when the entire adapter/socket assembly 100 is received on PC board 10. Alignment is provided by the contacting of the outer periphery of socket 110 with inside edges of guide walls 124. Use of alignment member 118 also allows withdrawal forces generated during removal of the device to be more evenly distributed over and through the alignment member rather than through the adapter and/or the BGA package. This feature allows the use of pry bar type extraction tools which in normal circumstances might cause damage to the adapter or BGA package. Other extraction devices suitable for use with adapter/socket assembly are described in U.S. Pat. No. 5,287,617, assigned to the assignee of this invention and incorporated herein by reference.

Figure 7:
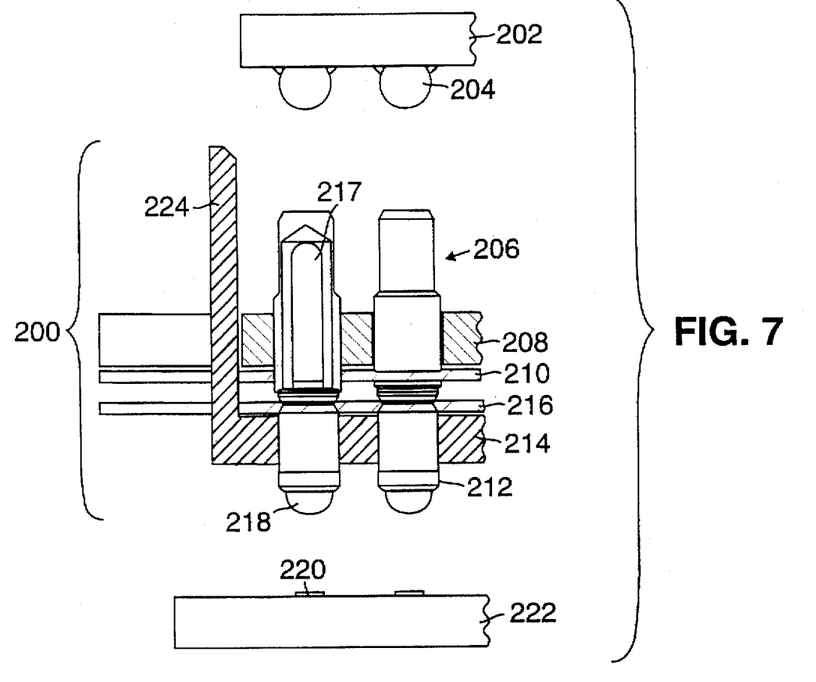
FIG. 7 is a cross-sectional side view of an alternate embodiment of a socket/adapter assembly prior to connection to a BGA package and circuit board.
Figure 8:
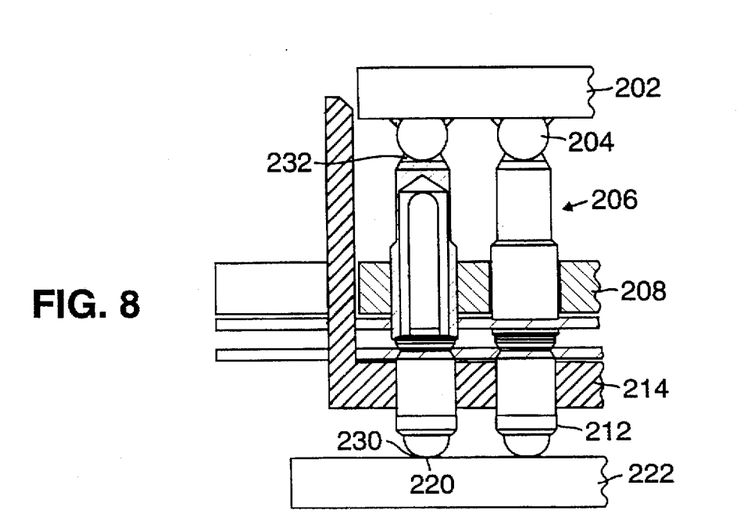
FIG. 8 is a cross-sectional side view of the socket/adapter assembly of FIG. 7 after connection to the BGA package and circuit board.
Figure 9:
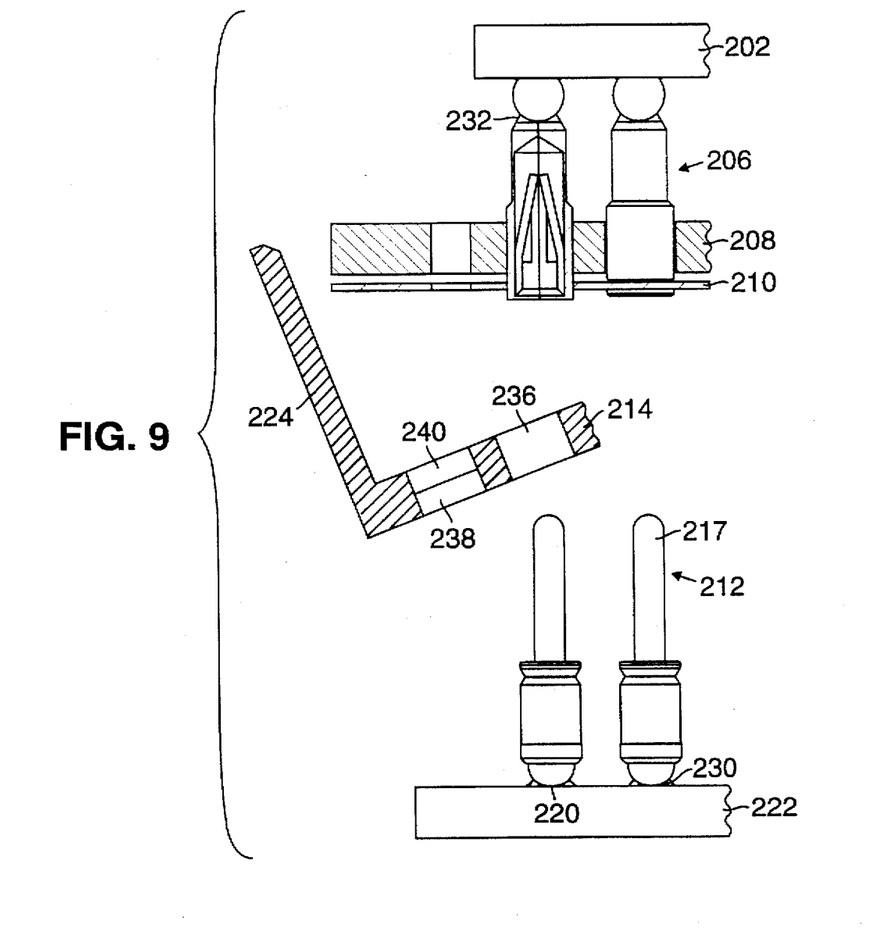
FIG. 9 is a cross-sectional side view of the socket/adapter assembly of FIG. 7 with the alignment member removed.

Referring to FIGS. 7–9, in another embodiment, a socket/adapter assembly 200 is used to convert a BGA IC package 202 into a socket grid array. Solder balls 204 of BGA package 202 are soldered to socket terminals 206 supported in an insulative socket support member 208. The socket terminals 206 are supported by a polyimide film 210 which, after soldering of the socket terminals to solder balls 204, is peeled-away to allow visual inspection of the solder connections after support member 208 is removed. The socket terminals receive pin terminals 212 which are supported within an insulative guide member 214. As was the case above, a peel-away polyimide film 216 surrounds each of the pin terminals. At the opposite end of the slender lead portion 217 of each male terminal is a rounded head portion 218 which is soldered to connection regions 220 of a PC board 222.

Referring to FIG. 7, the method of using socket/adapter assembly 200 includes positioning the array of pin terminals 212 supported within guide member 214 into the corresponding array of socket terminals 206 which are within socket support member 208. A guide wall member 224 vertically extending from the outer edge of insulative guide member 214 contacts an outer edge of socket support member 208 to align the guide member to the socket support member. As shown in the figures, guide wall member 224 may also contact the outer periphery BGA package 202 and aid in the alignment of solder balls 204 onto socket terminals 206. With the pin terminals 212 engaged within socket terminals 206, the rounded head portions 218 of pin terminals 212 are then positioned over connection regions 220 of PC board 222.

Referring to FIG. 8, soldering of socket terminals 206 to solder contact balls 204 and pin terminals 212 to connection regions 220 may be accomplished in a single soldering operation.

Referring to FIG. 9, after the solder operation, polyimide film 216 is peeled away from pin terminals 212. Insulative guide member 214 is then lifted off of pin terminals 212 to allow inspection of solder connections 230. In the same way, polyimide film 210 can be peeled away from the socket support member so that solder connections 232 can be examined and repaired if necessary. Both insulative guide member 214 and socket support member 208 can then be positioned back onto socket and pin terminals 206 and 212, respectively, thereby providing support to the terminals.

As shown in FIG. 9, a majority of the openings 236 are sized to provide a slip-fit between the terminal pins 212 and the openings. On the other hand, particular openings 238, for example, those at the outer periphery or corners of the insulative guide member may include a counterbore 240 of smaller diameter. Terminal pins disposed in openings 238 are press-fit within the counterbores so that, after removal of the polyimide film 216, guide member 214 is firmly held in place when positioned back on the terminal pins. As shown in FIGS. 7–9, the use of press-fit openings between terminal pins 212 and guide member 214 is equally applicable, to the interface between socket terminals 206 and terminal support member 208.

Solder preforms may be provided with socket and male pin terminals 206, 212 as discussed above in conjunction with socket/adapter assembly 100 (FIGS. 1–6).

Other embodiments are within the scope of the claims.

What is claimed is:

1. An intercoupling component for use with a substrate having an array of connection regions disposed on a surface of the substrate, the intercoupling component comprising:

an insulative support member having an upper surface and an opposite lower surface, the support member including an array of first holes extending transversely from the upper surface to the opposite lower surface, the array of first holes located in a pattern corresponding to the array of the connection regions, the insulative support member having a thickness between the upper and lower surfaces greater than 25% of a largest diameter of the terminal elements; and a plurality of terminal elements, positioned within the first holes and configured to be electrically connected to corresponding connection regions, wherein the first holes are sized to allow the insulative support member to be slidably removed from and replaced on the terminal elements after the terminal elements are connected to the connection regions to allow visual inspection of connections between the terminal elements and connection regions.

2. The intercoupling component of claim 1 wherein the insulative support member has a thickness sufficient for maintaining alignment of the terminal elements with respect to the connection regions.

3. The intercoupling component of claim 1 wherein the difference between outer diameters of the terminal elements and inner diameters of corresponding first holes is between 1 and 5 mils.

4. The intercoupling component of claim 1 further comprising a retaining sheet disposed over the lower surface of the insulative support member to retain the terminal elements within the insulative support member, the retaining sheet removable from the support member after the terminal elements are connected to the connection regions.

5. The intercoupling component of claim 4 wherein the retaining sheet is a polyimide film attached to the terminal elements supported by the insulative support member.

6. The intercoupling component of claim 1 wherein the terminal elements include pin terminals and the connection regions include contacts of a leadless integrated circuit package, the pin terminals soldered to the contacts.

7. The intercoupling component of claim 1 wherein the terminal elements include socket terminals and the connection regions include surface mounted pads of a printed circuit board, the socket terminals soldered to the surface mounted pads.

8. The intercoupling component of claim 7 wherein the socket terminals include terminations contacting the surface mounted pads, the terminations formed of a rigid material.

9. The intercoupling component of claim 1 wherein the insulative support member includes via holes extending therethrough from the upper surface to the opposite lower surface, the via holes interstitially disposed between the first holes.

10. The intercoupling component of claim 1 further comprising solder preforms disposed on the terminal elements.

11. An intercoupling component for use with a substrate having an array of connection regions disposed on a surface of the substrate, the intercoupling component comprising:

an insulative support member having an upper surface and an opposite lower surface, the support member including an array of first holes extending transversely from the upper surface to the opposite lower surface, the array of first holes located in a pattern corresponding to the array of the connection regions;

a plurality of terminal elements, positioned within the first holes and configured to be electrically connected to corresponding connection regions, wherein the first holes are sized to allow the insulative support member to be slidably removed from and replaced on the terminal elements after the terminal elements are connected to the connection regions to allow visual inspection of connections between the terminal elements and connection regions;

a plurality of socket terminals configured to be electrically connected to associated ones of a second array of connection regions, and a socket support member including second holes located in a pattern corresponding to a pattern of the second array of connection regions, the second holes extending therethrough from an upper surface to an opposite lower surface and configured to receive corresponding ones of the socket terminals, said socket terminals engaging associated ones of the pin terminals disposed in the insulative support member, the socket support member slidably removable from the socket terminals after the socket terminals are coupled to the corresponding second array of connection regions to allow visual inspection of connections between the socket terminals and second array of connection regions.

12. The intercoupling component of claim 11 wherein the socket support member includes second via holes extending therethrough from an upper surface to an opposite lower surface, the second via holes interstitially disposed between the second holes.

13. The intercoupling component of claim 11 further comprising a retaining sheet disposed over a surface of the socket support member and adapted to retain the socket terminals within the socket support member, the retaining sheet removable from the socket terminals after the socket terminals are connected to the second array of connection regions to allow removal of the socket support member.

14. The intercoupling component of claim 11 further comprising a removable alignment member having third holes extending therethrough from an upper surface to an opposite lower surface of the removable alignment member, the third holes located in a pattern corresponding to a pattern of the first holes and sized to allow the pin terminals disposed in the insulative support member to pass through the third holes and engage corresponding socket terminals disposed in the socket support member, the alignment member including guide elements vertically extending from the upper surface of the alignment member to align outer peripheral portions of the integrated circuit package, insulative support member, and socket support member during assembly of the intercoupling component.

15. The intercoupling component of claim 11 further comprising a retaining sheet disposed over the lower surface of the insulative support member to retain the terminal elements within the insulative support member, the retaining sheet removable from the support member after the terminal elements are connected to the connection regions.

16. The intercoupling component of claim 11 further comprising a second retaining sheet disposed over a surface of the socket support member and adapted to retain the socket terminals within the socket support member, the second retaining sheet removable from the socket terminals after the socket terminals are connected to the second array of connection regions to allow removal of the socket support member.

17. The intercoupling component of claim 11 further comprising solder preforms disposed on the terminal elements.

* * * * *